[12] United States Patent
Alharbi et al.

(10) Patent No.: US 10,732,316 B2
(45) Date of Patent: Aug. 4, 2020

(54) ASSESSMENT OF INACCESSIBLE PORE VOLUME FOR POLYMER FLOODING

(71) Applicant: Saudi Arabian Oil Company, Dhahran (SA)

(72) Inventors: Ahmad Mubarak Alharbi, Dammam (SA); Hyung Tae Kwak, Dhahran (SA); Jun Gao, Al Khobar (SA)

(73) Assignee: SAUDI ARABIAN OIL COMPANY (SA)

( * ) Notice: Subject to any disclaimer, the term of this patent is extended or adjusted under 35 U.S.C. 154(b) by 168 days.

(21) Appl. No.: 16/102,992

(22) Filed: Aug. 14, 2018

(65) Prior Publication Data
US 2020/0057172 A1 Feb. 20, 2020

(51) Int. Cl.
G01V 3/32 (2006.01)
E21B 43/20 (2006.01)
G01N 15/08 (2006.01)
G01N 24/08 (2006.01)
G01R 33/44 (2006.01)
G01V 3/38 (2006.01)

(52) U.S. Cl.
CPC ............ G01V 3/32 (2013.01); E21B 43/20 (2013.01); G01N 15/088 (2013.01); G01N 24/081 (2013.01); G01R 33/448 (2013.01); G01V 3/38 (2013.01)

(58) Field of Classification Search
None
See application file for complete search history.

(56) References Cited

U.S. PATENT DOCUMENTS

| 3,213,356 | A | 10/1965 | Brown et al. |
| 4,022,276 | A | 5/1977 | Dreher et al. |
| 5,162,733 | A | 11/1992 | Baldwin |
| 2006/0116828 | A1 | 6/2006 | Chen et al. |
| 2012/0241149 | A1 | 9/2012 | Chen et al. |
| 2015/0015250 | A1 | 1/2015 | Chen et al. |
| 2015/0346377 | A1 | 12/2015 | Jebutu et al. |
| 2016/0132131 | A1 | 5/2016 | Han et al. |
| 2016/0370492 | A1 | 12/2016 | Chen et al. |
| 2018/0032356 | A1 | 2/2018 | Su et al. |

FOREIGN PATENT DOCUMENTS

WO 2016126759 A1 8/2016

OTHER PUBLICATIONS

AlSofi et al., "Systematic Development and Laboratory Evaluation of Secondary Polymer Augmentation for a Slightly Viscous Arabian Heavy Reservoir," SPE-183793-MS (2017).

(Continued)

Primary Examiner — Douglas X Rodriguez
(74) Attorney, Agent, or Firm — Bracewell LLP; Constance Gall Rhebergen

(57) ABSTRACT

Embodiments relate to methods for assessing inaccessible pore volume for polymer flooding. The methods include utilizing nuclear magnetic resonance to monitor polymer-based fluid displacements into porous media. According to an embodiment, the method includes providing a core sample of a porous medium, determining a total pore volume of the core sample, introducing polymer solutions, obtaining nuclear magnetic resonance relaxation time distributions of water within the core sample, and assessing the inaccessible pore volume.

19 Claims, 6 Drawing Sheets

(56) References Cited

OTHER PUBLICATIONS

Bhupendra et al., "The Effect of Inaccessible Pore Volume on the Flow of Polymer and Solvent Through Porous Media," SPE-7586 (1978).
Dang et al., "Development of Isotherm Polymer/Surfactant Adsorption Models in Chemical Flooding," SPE-147872 (2011).
Dawson et al., "Inaccessible Pore Volume in Polymer Flooding," SPE-3522 (1972).
Liu et al., "Pore-scale investigation of residual oil displacement in surfactant-polymer flooding using nuclear magnetic resonance experiments," 13 Pet. Sci. 91 (2016).
Pancharoen et al., "Inaccessible Pore Volume of Associative Polymer Floods," SPE-129910 (2010).
Vashaee et al., "Local T2 measurement employing longitudinal Hadamard encoding and adiabatic inversion pulses in porous media," 261 Journal of Magnetic Resonance 141 (2015).
Bahadur et al., "Determination of closed porosity in rocks by small angle neutron scattering", Journal of Applied Crystallography, 2016, pp. 2021-2030, Union of Crystallography.
International Search Report and Written Opinion for related PCT application PCT/US2019/046223 dated Oct. 24, 2019.
Lund et al., "Polymer retention and inaccessible pore volume in North Sea reservoir material", Journal of Petroleum Science and Engineering, 1992, pp. 25-32, Elsevier Science Publishers.
Yiqi et al., "Laboratory Experiment on Inaccessible Pore Volume of Polymer Flooding", Advances in Petroleum Exploration and Development, 2017, pp. 42-45, vol. 13, No. 1, Canadian Research & Development Center of Sciences and Cultures.
Zhao et al., "Distribution and Presence of Polymers in Porous Media", Energies, 2017, pp. 13, vol. 10, No. 12.

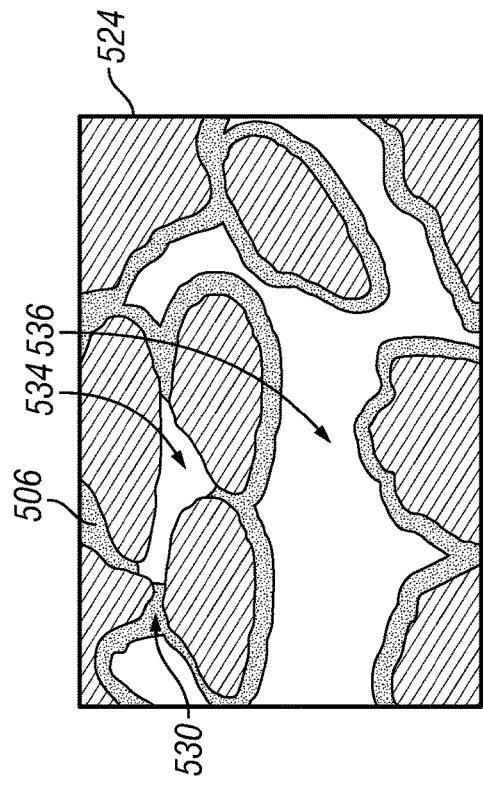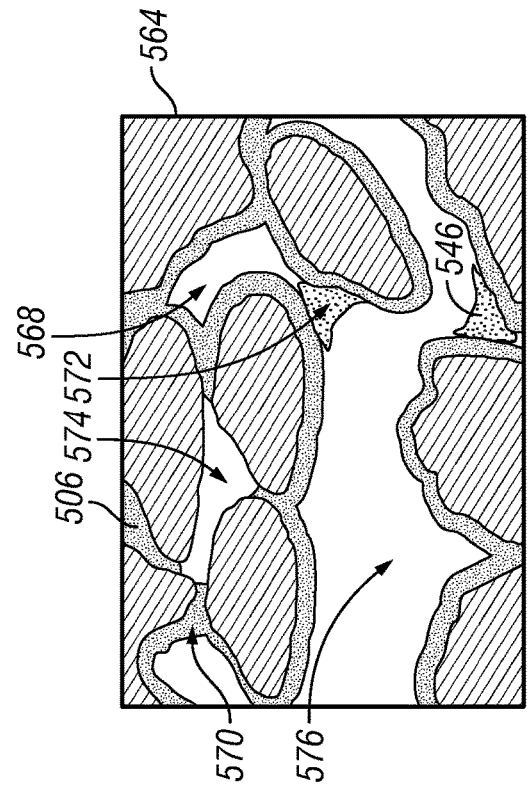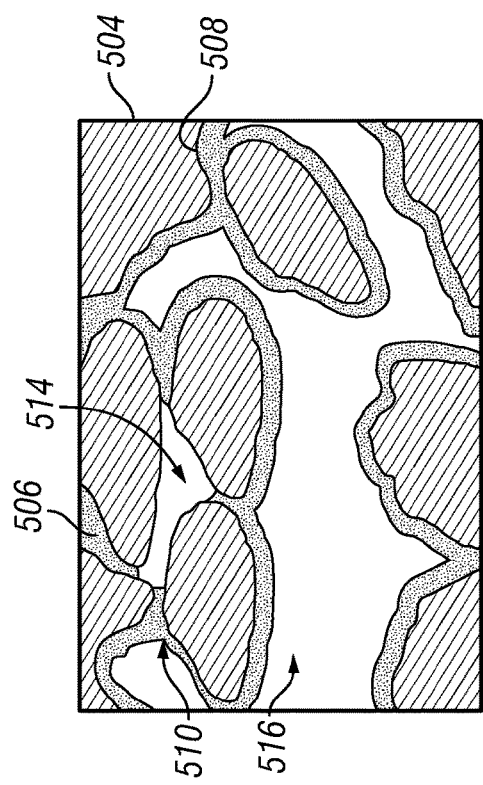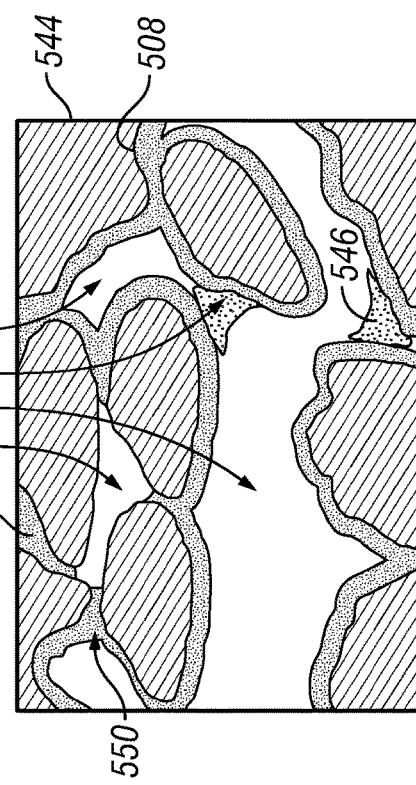

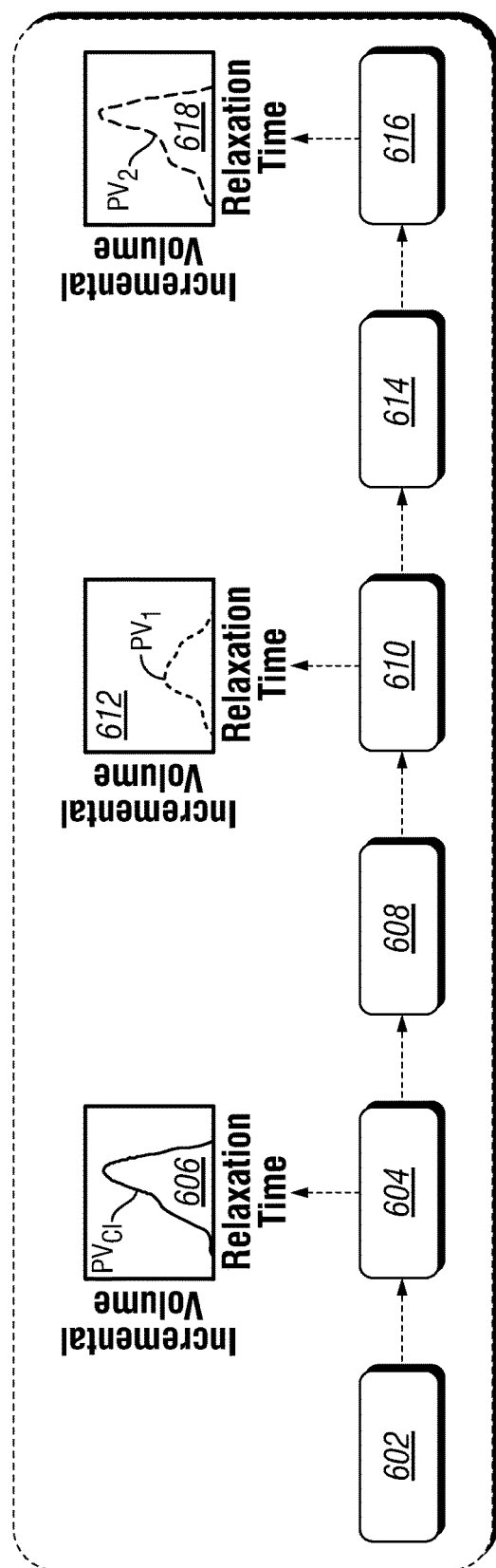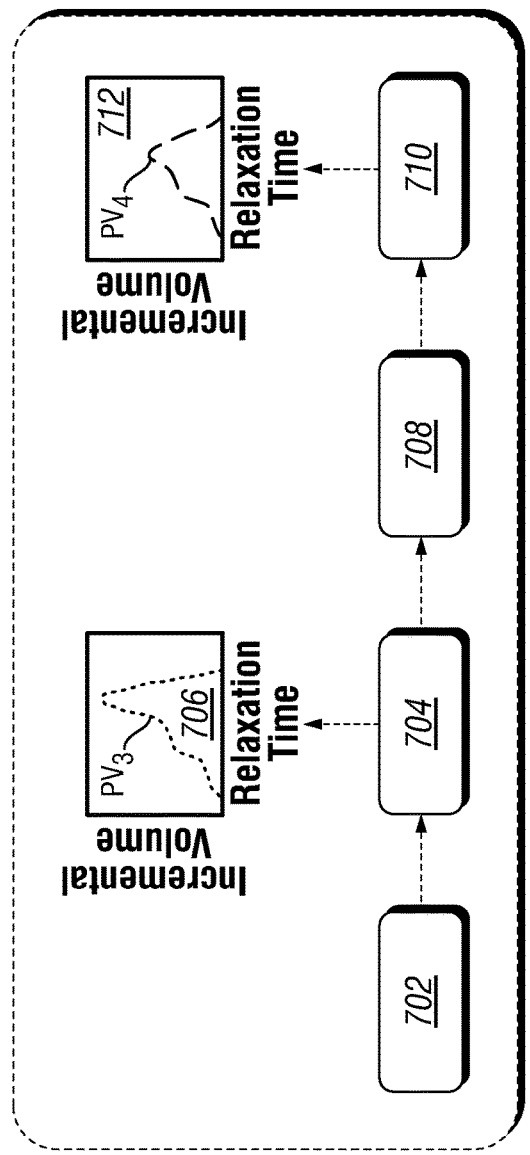
FIG. 6
FIG. 7

ASSESSMENT OF INACCESSIBLE PORE VOLUME FOR POLYMER FLOODING

BACKGROUND

1. Field

Embodiments generally relate to polymer flooding. More particularly, embodiments relate to methods to assess inaccessible pore volume for polymer flooding.

2. Description of the Related Art

Polymer flooding is considered a technique used for enhanced oil recovery (EOR). In EOR, a greater degree of mobility control is achieved during water flooding by injecting foreign materials not present in the hydrocarbon-bearing formation. The addition of a polymer increases the viscosity of the injected water and reduces the permeability of the formation. As a result, the mobility of the injected water is reduced. The polymer is typically injected as a slug or bank solution into the formation. It is usually followed by water injection for actual hydrocarbon production.

In terms of successfully designing a polymer flood, a number of parameters should be considered and assessed prior to field application. One of those parameters is inaccessible pore volume (IPV), which is a quantity corresponding to the volume of a pore space that cannot be accessed by polymer molecules during polymer flooding.

In the absence of polymer adsorption to the porous medium surface, polymer molecules are prone to travel faster through a porous medium than inert tracer species such as salts or solvents. Once the polymer molecule reaches a pore throat, there is a possibility that the polymer molecule may plug or hinder further access through the pore throat. There are several reasons this may occur, including the size of the pore throat, the molecular weight of the polymer molecule, or the shape of the polymer molecule as it passes into the pore throat. When polymer molecules in solution are no longer able to access a pore space due to plugging or static hindrance, the void space that can no longer be accessed becomes an IPV. Therefore, for a skilled practitioner to mitigate the level of uncertainty in designing an EOR plan for a reservoir, assessing the potential for IPV to occur is an important consideration.

Attempts have been made to measure the IPV value by conducting core flood experiments. In these experiments, effluents are collected and concentration or composition profiles of those effluents are analyzed to estimate the IPV value. However, IPV estimates derived from these experiments possess significant degrees of inconsistency or systematic errors, limiting the accuracy of IPV measurement and time efficiency for designing polymer floods for EOR.

SUMMARY

Embodiments relate to methods to assess IPV for polymer flooding. Nuclear magnetic resonance (NMR) is utilized to monitor the polymer-based fluid displacements into a porous medium. Embodiments further provide methods to directly assess the IPV value in the absence of analyzing effluents, which improve the accuracy of IPV measurement and time efficiency.

Embodiments provide a method for determining IPV of a porous medium for polymer flooding. The method includes the step of providing a core sample of the porous medium. The method also includes the step of determining a core initial pore volume or total pore volume (collectively referred to as $PV_{CI}$) of the core sample. The method also includes the step of introducing a first polymer solution into the core sample until saturation. The first polymer solution includes water and a polymer. The polymer is configured to plug at least one pore throat of the core sample. The method also includes the step of determining a first pore volume ($PV_3$) by obtaining NMR relaxation time of protons, hydrogen atoms, hydrogen cations, or hydrogen nuclei (collectively referred to as $^1H$) within the core sample. The method also includes the step of introducing a second polymer solution into the core sample until saturation. The second polymer solution includes deuterium oxide ($D_2O$) and the polymer. The first polymer solution and the second polymer solution have substantially the same polymer concentration. The method also includes the step of determining a second pore volume ($PV_4$) by obtaining NMR relaxation time of $^1H$ within the core sample. The method also includes the step of assessing the IPV by utilizing $PV_{CI}$, $PV_3$, and $PV_4$ as parameters.

In some embodiments, the method further includes the step of wetting the core sample with a reference solution until saturation. The reference solution includes water. In some embodiments, the $PV_{CI}$ is determined by obtaining NMR relaxation time of $^1H$ within the core sample. In some embodiments, the polymer includes polyacrylamides, sulfonated polyacrylamides, xanthan gum, and hydrophobically modified ethoxylated urethanes (HEURs). In some embodiments, the first polymer solution has a polymer concentration ranging from about 100 parts per million (ppm) to about 1,500 ppm. In some embodiments, the NMR relaxation time is a transverse (or spin-spin, collectively referred to as $T_2$) relaxation time.

In some embodiments, the method further includes the step of introducing a third polymer solution into the core sample until saturation prior to the introducing the first polymer solution step. The third polymer solution includes $D_2O$ and the polymer. The third polymer solution has a greater polymer concentration than the first polymer solution. The polymer is configured to adsorb onto the pore surfaces of the core sample. In some embodiments, the method further includes the step of introducing a fourth polymer solution into the core sample until saturation prior to the introducing the first polymer solution step but after the introducing the third polymer solution step. The fourth polymer solution includes water and the polymer. The third polymer solution and the fourth polymer solution have substantially the same polymer concentration. In some embodiments, the third polymer solution has a polymer concentration ranging from about 1,500 ppm to about 6,000 ppm.

Embodiments provide a method for determining IPV of a porous medium for polymer flooding. The method includes the step of providing a core sample of the porous medium. The method also includes the step of wetting the core sample with a reference solution until saturation. The reference solution includes water. The method also includes the step of determining a $PV_{CI}$ by obtaining NMR $T_2$ relaxation time of water within the core sample. The method also includes the step of introducing a first polymer solution into the core sample and monitoring the introduction by obtaining NMR $T_2$ relaxation time of water within the core sample until saturation. The first polymer solution includes $D_2O$ and a polymer. The polymer is configured to adsorb onto the pore surfaces of the core sample. The method also includes the step of introducing a second polymer solution into the core sample and monitoring the introduction by obtaining NMR $T_2$ relaxation time of water within the core sample until saturation. The second polymer solution includes water and the polymer. The first polymer solution and the second polymer solution have substantially the same polymer concentration. The method also includes the step of introducing a third polymer solution into the core sample and monitoring the introduction by obtaining NMR $T_2$ relaxation time of water within the core sample until saturation to determine a $PV_3$, where the third polymer solution includes water and the polymer. The first polymer solution has a greater polymer concentration than the third polymer solution. The polymer is configured to plug at least one pore throat of the core sample. The method also includes the step of introducing a fourth polymer solution into the core sample and monitoring the introduction by obtaining NMR $T_2$ relaxation time of water within the core sample until saturation to determine a $PV_4$. The fourth polymer solution includes $D_2O$ and the polymer. The third polymer solution and the fourth polymer solution have substantially the same polymer concentration. The method also includes the step of assessing the IPV by utilizing $PV_{CI}$, $PV_3$, and $PV_4$ as parameters.

In some embodiments, the polymer includes polyacrylamides, sulfonated polyacrylamides, xanthan gum, and HEURs. In some embodiments, the first polymer solution has a polymer concentration ranging from about 1,500 ppm to about 6,000 ppm. In some embodiments, the third polymer solution has a polymer concentration ranging from about 100 ppm to about 1,500 ppm. In some embodiments, in the step of introducing the first solution, the polymer is configured to plug at least one pore throat.

Embodiments provide a method for EOR from a hydrocarbon-bearing formation using polymer flooding. The method includes the step of obtaining core samples from the hydrocarbon-bearing formation. The method also includes the step of determining IPV for each of the core samples. Each of the core samples is flooded with at least two polymer compositions. Each polymer composition is significantly different from one another. The method also includes the step of preparing a polymer slug. The polymer slug includes one of the at least two polymer compositions in the determining step. The method also includes the step of introducing the polymer slug into the formation for EOR.

In some embodiments, the determining IPV step further includes the step of determining a $PV_{CI}$ for each of the core samples. The determining IPV step further includes the step of introducing a first polymer solution into each of the core samples until saturation. The first polymer solution includes water and one of the at least two polymer compositions for each of the core samples. The one of the at least two polymer compositions is configured to plug at least one pore throat of each of the core samples. The determining IPV step further includes the step of determining a $PV_3$ for each of the core samples by measuring NMR $T_2$ relaxation time of $^1H$ within each of the core samples. The determining IPV step further includes the step of introducing a second polymer solution into each of the core samples until saturation. The second polymer solution includes $D_2O$ and the one of the at least two polymer compositions for each of the core samples. The first polymer solution and the second polymer solution have substantially the same polymer concentration. The determining IPV step further includes the step of determining a $PV_4$ for each of the core samples by measuring NMR $T_2$ relaxation time of $^1H$ within each of the core samples. The determining IPV step further includes the step of assessing the IPV by utilizing $PV_{CI}$, $PV_3$, and $PV_4$ as parameters for each of the core samples.

In some embodiments, the first polymer solution has a polymer concentration ranging from about 100 ppm to about 1,500 ppm. In some embodiments, the method further includes the step of introducing a third polymer solution into each of the core samples until saturation. The third polymer solution includes $D_2O$ and the one of the at least two polymer compositions for each of the core samples. The third polymer solution has a greater polymer concentration than the first polymer solution. The one of the at least two polymer compositions is configured to adsorb onto the pore surfaces of each of the core samples. In some embodiments, the method further includes the step of introducing a fourth polymer solution into each of the core samples until saturation. The fourth polymer solution includes water and the one of the at least two polymer compositions for each of the core samples. The third polymer solution and the fourth polymer solution have substantially the same polymer concentration. In some embodiments, the third polymer solution has a polymer concentration ranging from about 1,500 ppm to about 6,000 ppm.

BRIEF DESCRIPTION OF THE DRAWINGS

So that the manner in which the previously-recited features, aspects, and advantages of the embodiments of this disclosure as well as others that will become apparent are attained and can be understood in detail, a more particular description of the disclosure briefly summarized previously may be had by reference to the embodiments that are illustrated in the drawings that form a part of this specification. However, it is to be noted that the appended drawings illustrate only certain embodiments of the disclosure and are not to be considered limiting of the disclosure's scope as the disclosure may admit to other equally effective embodiments.

FIG. 3A shows a polymer-based fluid displacement process where a first polymer solution is introduced into the porous medium. FIG. 3B shows a polymer-based fluid displacement process where a second polymer solution is introduced into the porous medium once polymer adsorption from the first polymer solution reaches equilibrium.

FIGS. 5A-D are schematic representations of expected sources of NMR signals within a porous medium after a series of polymer-based fluid displacements in accordance with an embodiment of this disclosure. FIG. 5A shows expected sources of NMR signals after a first polymer solution is introduced into the core sample until saturation. Prior to introducing the first polymer solution, the core sample is wetted with a reference solution. FIG. 5B shows expected sources of NMR signals after a second polymer solution is introduced into the core sample until saturation. FIG. 5C shows expected sources of NMR signals after a third polymer solution is introduced into the core sample until saturation. FIG. 5D shows expected sources of NMR signals after a fourth polymer solution is introduced into the core sample until saturation.

FIG. 6 is a schematic representation of a workflow for assessing the IPV using NMR $T_2$ measurement techniques in accordance with an embodiment of this disclosure. In the graphs, the solid line represents incremental volume of a NMR $T_2$ relaxation time distribution for determining $PV_{CI}$. The short dashed line represents incremental volume of a NMR $T_2$ relaxation time distribution for determining a first reference volume ($PV_1$). The intermediate dashed line represents incremental volume of a NMR $T_2$ relaxation time distribution for determining a second reference volume ($PV_2$).

FIG. 7 is a schematic representation of a workflow for assessing the IPV using NMR $T_2$ measurement techniques in accordance with an embodiment of this disclosure. In the graphs, the dotted line represents incremental volume of a NMR $T_2$ relaxation time distribution for determining $PV_3$. The long dashed line represents incremental volume of a NMR $T_2$ relaxation time distribution for determining $PV_4$.

DETAILED DESCRIPTION

Figure 1:
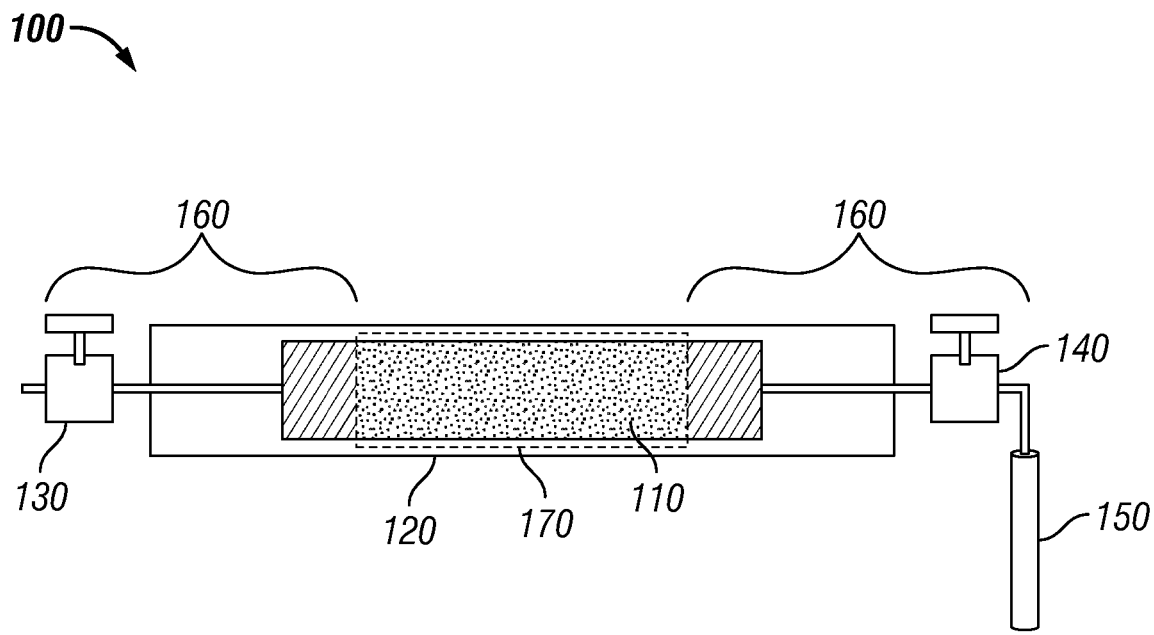
FIG. 1 is a schematic representation of a coreflood apparatus used for measuring IPV in accordance with an embodiment of this disclosure.

The disclosure refers to particular features, including process or method steps. Those of skill in the art understand that the disclosure is not limited to or by the description of embodiments given in the specification. The subject matter of this disclosure is not restricted except only in the spirit of the specification and appended claims.

Those of skill in the art also understand that the terminology used for describing particular embodiments does not limit the scope or breadth of the embodiments of the disclosure. In interpreting the specification and appended claims, all terms should be interpreted in the broadest possible manner consistent with the context of each term. All technical and scientific terms used in the specification and appended claims have the same meaning as commonly understood by one of ordinary skill in the art to which this disclosure belongs unless defined otherwise. Like numbers refer to like elements throughout the disclosure.

Although the disclosure has been described with respect to certain features, it should be understood that the features and embodiments of the features can be combined with other features and embodiments of those features.

Although the various embodiments have been described in detail, it should be understood that various changes, substitutions, and alternations can be made without departing from the principle and scope of these embodiments. Accordingly, the scope of the various embodiments should be determined by the following claims and their appropriate legal equivalents.

As used throughout the disclosure, the singular forms "a," "an," and "the" include plural references unless the context clearly indicates otherwise.

As used throughout the disclosure, the words "comprise," "has," "includes," and all other grammatical variations are each intended to have an open, non-limiting meaning that does not exclude additional elements, components or steps. Embodiments of the present disclosure may suitably "comprise," "consist," or "consist essentially of" the limiting features disclosed, and may be practiced in the absence of a limiting feature not disclosed. For example, it can be recognized by those skilled in the art that certain steps can be combined into a single step.

Optional or optionally means that the subsequently described event or circumstances can or may not occur. The description includes instances where the event or circumstance occurs and instances where it does not occur.

Where a range of values is provided in the specification or in the appended claims, it is understood that the interval encompasses each intervening value between the upper limit and the lower limit as well as the upper limit and the lower limit. The disclosure encompasses and bounds smaller ranges of the interval subject to any specific exclusion provided. "Substantial" means equal to or greater than 1% by the indicated unit of measure. "Significant" means equal to or greater than 0.1% of the indicated unit of measure. "Detectable" means equal to or greater than 0.01% by the indicated unit of measure.

Where reference is made in the specification and appended claims to a method comprising two or more defined steps, the defined steps can be carried out in any order or simultaneously except where the context excludes that possibility.

As used throughout the disclosure, terms such as "first," "second," "third", and "fourth" are arbitrarily assigned and are merely intended to differentiate between two or more elements of a method. It is to be understood that the words "first," "second," "third", and "fourth" serve no other purpose and are not part of the name or description of the element, nor do they necessarily define a relative sequence of the element. Furthermore, it is to be understood that that the mere use of the term "first" and "second" does not require that there be any "third" component, although that possibility is contemplated under the scope of the present disclosure.

As used throughout the disclosure, spatial terms describe the relative position of an object or a group of objects relative to another object or group of objects. The spatial relationships apply along vertical and horizontal axes. Orientation and relational words, including "uphole," "downhole," and other like terms, are for descriptive convenience and are not limiting unless otherwise indicated.

As used throughout the disclosure, the terms "inaccessible pore volume" or "IPV" refer to a percentage, magnitude, or volume of a connected pore space that cannot be accessed by polymer molecules.

As used throughout the disclosure, the terms "nuclear magnetic resonance," "NMR," "magnetic resonance," or "MR" refer to a physical phenomenon where nuclei placed in a magnetic field absorb and emit electromagnetic radiation.

As used throughout the disclosure, polymers used for the various embodiments include any polymer suitable for polymer flooding. In some embodiments, the polymer is water-soluble. In some embodiments, the polymer forms a suspension or emulsion with a water-equivalent solvent. In some embodiments, the polymer forms a suspension or emulsion either with or without a salt. In some embodiments, the polymer forms a suspension or emulsion either with or without a surfactant. In some embodiments, the polymer is either hydrolyzed or not. Non-limiting examples of suitable polymers include polyacrylamides, sulfonated polyacrylamides, xanthan gum, and HEURs.

As used throughout the disclosure, polymer concentrations are expressed in parts-per notations such as "parts per million" or "ppm." The parts-per notations are dimensionless quantities describing mass fractions. For example, a 10 ppm polymer solution is equivalent to 10 milligrams of polymer solute per one kilogram of polymer solution. The mass of the polymer solution is equivalent to the sum of the total solute mass and the total solvent mass. Molar concentrations are typically not used for polymers due to the difficulty to discern the molecular weights of those polymers. A polymer may have an estimated median molecular weight of about twelve million Daltons.

As used throughout the disclosure, the terms "adsorption" or "polymer adsorption" refer to the retention of polymer molecules onto surfaces of the porous medium.

As used throughout the disclosure, the term "water" can include, for example, a brine, a connate water, surface water, distilled water, carbonated water, sea water, and a combination thereof.

FIG. 1 shows a schematic representation of a coreflood apparatus 100 used for measuring IPV in accordance with an embodiment of this disclosure. IPV is measured by conducting a coreflood or displacement experiment on a core sample 110 obtained from a hydrocarbon-bearing formation or reservoir. The core sample 110 is placed in a core holder 120. The coreflood experiment is conducted using a fluid flow where the injectable fluids include water, a polymer solution, or both. Various salts having ions such as halides, sulfates, nitrates, alkalis, alkaline earths, amines, or any combination thereof can be dissolved in water. Water can be substituted by a brine solution. The polymer solution includes a polymer dissolved in water. The polymer solution may include the polymer dissolved in brine. The polymer solution may include tracer species. Non-limiting examples of tracer species include sodium naphthalene sulfonate, sodium naphthalene disulfonate, sodium naphthalene trisulfonate, and isopropanol. The injectable fluids are injected from the injection side 130 through the core sample 110 where any effluents from the effluent side 140 are collected in a sampling tube 150 as a function of time.

Typically, collected effluents are further analyzed to estimate the IPV. However, IPV values estimated by analyzing effluents usually include significant degrees of error or uncertainty. As shown in FIG. 1, systematic errors may arise from dead-volume 160 of the coreflood apparatus 100, either on the injection side 130, or the effluent side 140, or both. Systematic errors may arise from instruments used for collecting effluent samples. Systematic errors may arise from instruments used for measuring salt concentrations. Systematic errors may arise from instruments used for measuring polymer concentrations. Systematic errors may arise from choosing the correct method, if any, for estimating an IPV value.

On the other hand, embodiments may involve NMR to monitor any $^1$H-containing fluids present in the core sample 110 without any effluent analysis. Accordingly, these systematic errors or uncertainties are not existent when IPV is measured directly from the core sample 110 or even directly in situ. As shown in FIG. 1, a displacement experiment can be conducted in an NMR instrument where the NMR measurement zone 170 does not include any volume contributing to the dead-volume 160. Incorporating NMR measurement techniques provides a direct assessment of porosity or pore volume from only the core sample 110. NMR measurement can be conducted either concurrently or sequentially while the injection fluid is introduced into the core sample 110.

In some embodiments, NMR is used to measure the $T_2$ relaxation time of an injection fluid including $^1$H. The NMR instrument can be any instrument capable of detecting $T_2$ relaxation. The NMR instrument can be any instrument capable of locally placing the magnetic field in a desired zone, such as the NMR measurement zone 170 shown in FIG. 1. In some embodiments, such NMR instruments may have resonance frequencies ranging from about one megahertz (MHz) to about 20 MHz. In other embodiments, the NMR instrument may have a resonance frequency ranging from about 10 MHz to about 14 MHz due to having a greater sensitivity and providing prompt $T_2$ relaxation time distribution. In some embodiments, the NMR instrument can be any instrument capable of selectively detecting the magnetic resonance of $^1$H while leaving deuterium ($^2$H or D, collectively referred to as D) minimally detected or undetected. In other embodiments, NMR techniques are used to measure the longitudinal (or spin-lattice, collectively referred to as $T_1$) relaxation time. Still in other embodiments, high-field NMR techniques can be utilized to selectively detect isotopes or elements other than $^1$H, such as D, $^{13}$C, $^{14}$N, $^{15}$N, $^{17}$O, $^{29}$Si, $^{31}$P, or $^{35}$Cl.

Figure 2:
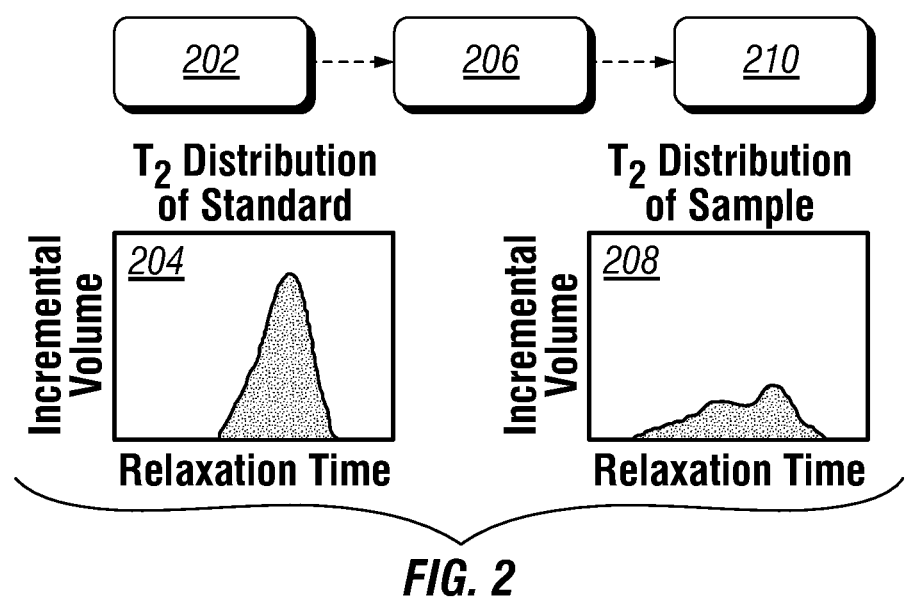
FIG. 2 is a schematic representation for measuring pore volume using NMR in accordance with an embodiment of this disclosure.

FIG. 2 shows a schematic representation for measuring pore volume using NMR in accordance with an embodiment of this disclosure. Once a spectrum showing NMR $T_2$ relaxation time distribution is obtained for a core sample, pore volume is typically calculated by taking the sum of the amplitudes of the $T_2$ relaxation time distribution or integrating the distribution to calculate the area. The area corresponds to the pore volume of the core sample. In block 202, an NMR measurement is conducted for an NMR-responsive reference bulk fluid having a known volume. A $T_2$ relaxation time distribution is obtained for the reference bulk fluid as shown for example in graph 204. In block 206, a core sample is obtained and is flooded with the same NMR-responsive fluid used in block 202 until the core sample is substantially saturated. Still in block 206, an NMR measurement is conducted for the core sample where the volume is unknown. A $T_2$ relaxation time distribution spectrum is obtained for the core sample as shown for example in graph 208. In block 210, the pore volume of the core sample is calculated by calibrating the spectrum of the $T_2$ relaxation time distribution of the core sample (shown for example in graph 204) to the spectrum of the $T_2$ relaxation time distribution of the reference bulk fluid (shown for example in graph 208). Because the volume of the reference bulk fluid is known, the pore volume of the core sample is derived by equation (1):

$$PV = (\text{Bulk Volume}) \times \frac{(\text{Sample Area})}{(\text{Bulk Area})} \quad (1)$$

where PV is the pore volume of the core sample, (Bulk Volume) is the known volume of the reference bulk fluid, (Sample Area) is the integrated area of the $T_2$ relaxation time distribution of the core sample shown for example in graph 208, and (Bulk Area) is the integrated area of the $T_2$ relaxation time distribution of the reference bulk fluid shown for example in graph 204.

Figure 3A:
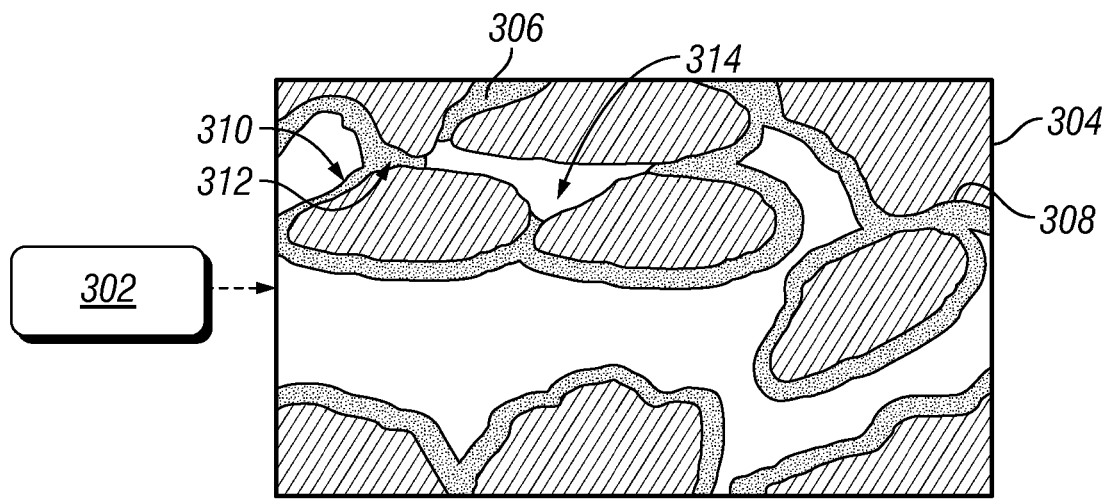
FIGS. 3A-B are schematic representations of the polymer-based fluid displacement processes occurring within porous media where two polymer solutions having different concentrations are prepared and sequentially introduced into the porous medium in accordance with an embodiment of this disclosure.
Figure 3B:
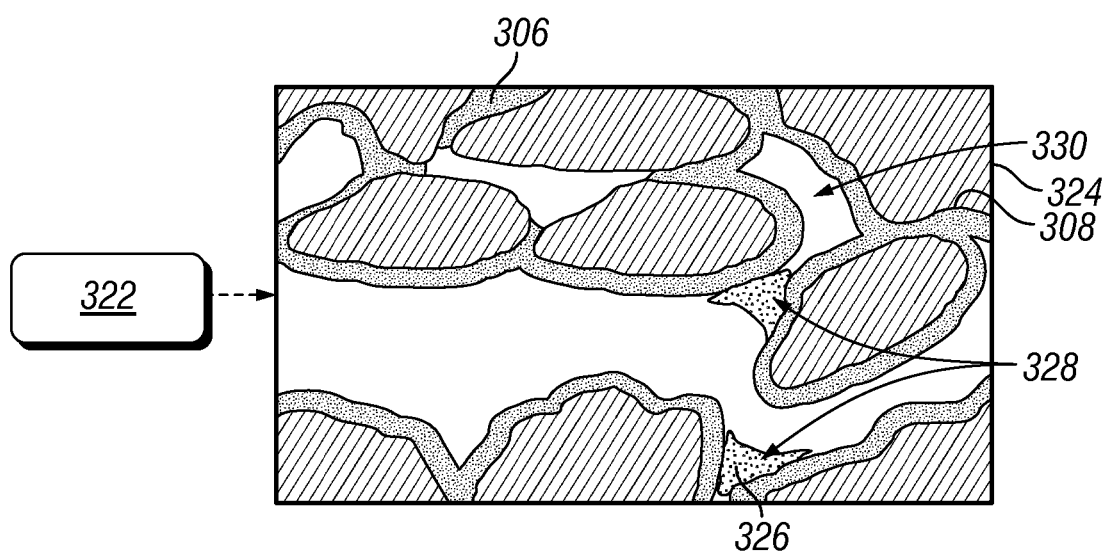

FIGS. 3A-B show schematic representations of the polymer-based fluid displacement processes occurring within porous media where two polymer solutions having different concentrations are prepared and sequentially introduced into the porous medium in accordance with an embodiment of this disclosure. FIG. 3A shows a polymer-based fluid displacement process where a first polymer solution is introduced into the porous medium. In block 302, a first polymer solution is introduced into a core sample of a porous medium until saturation. In some embodiments, the first polymer solution may have a polymer concentration ranging from about 1,500 ppm to about 6,000 ppm. In other embodiments, the first polymer solution may have a polymer concentration ranging from about 2,000 ppm to about 3,000 ppm. Once the first polymer solution is substantially introduced as shown in core sample 304, polymer molecules 306 from the first polymer solution adsorb onto the pore surfaces 308 of the core sample 304. In some embodiments, polymer molecules 306 from the first polymer solution travel through the core sample 304 and adsorb onto pore surfaces 308 as shown for example in area 310. In some embodiments, polymer molecules 306 from the first polymer solution travel through the core sample 304 and reach a pore throat as shown for example in area 312. Once the polymer molecules 306 reach a pore throat, the polymer molecules 306 may plug or hinder further access through the pore throat as shown for example in area 312. There are several reasons this may occur, including the size of the pore throat, the molecular weight of the polymer molecules 306, or the shape of the polymer molecules 306 as they pass into the pore throat. Due to plugging or static hindrance, the polymer molecules 306 are no longer able to access area 314. The void space such as area 314 that can no longer be accessed by polymer molecules 306 becomes an IPV. Because polymer molecules tend to travel faster than solvents or salts upon introduction of a polymer solution, solvents or salts may not penetrate through the plugged pore throats after the pore throats are completely plugged. On the other hand, if the plugging event is not complete, some solvents or salts may pass through these pore throats. The polymer-based fluid displacement process shown in FIG. 3A is conducted to minimize the negative impact of polymer adsorption when a second polymer solution is introduced into the core sample for the actual measurement of the IPV using NMR techniques.

FIG. 3B shows a polymer-based fluid displacement process where a second polymer solution is introduced into the porous medium once polymer adsorption from the first polymer solution reaches equilibrium. In block 322, a second polymer solution is introduced into the core sample until saturation. The first polymer solution has a greater polymer concentration than the second polymer solution. Without being bound by any theory, a polymer solution having relatively greater polymer concentration has polymer molecules smaller in size than a polymer solution having relatively lesser polymer concentration. Without being bound by any theory, polymer molecules that are relatively smaller in size adsorb to pore surfaces better than polymer molecules that are relatively larger in size. Due to the first polymer solution having polymer molecules smaller in size than the second polymer solution, introduction of the first polymer solution into the core sample ensures that polymer molecules are substantially adsorbed to the pore surfaces. This way, when the second polymer solution is introduced into the core sample for actual IPV evaluation, the polymer molecules of the second polymer solution do not exhibit any adsorption. In some embodiments, the second polymer solution may have a polymer concentration ranging from about 100 ppm to about 1,500 ppm. In other embodiments, the second polymer solution may have a polymer concentration ranging from about 500 ppm to about 1,000 ppm. One skilled in the art would appreciate that the polymer concentration of the second polymer solution may vary depending on the targeted EOR mobility for different reservoirs. Because polymer molecules 306 in the first polymer solution have already adsorbed onto the pore surfaces 308 of the core sample 324, polymer molecules 326 in the second polymer solution would not exhibit further adsorption once the second polymer solution is substantially introduced. In some embodiments, polymer molecules 326 in the second polymer solution travel through the core sample 324 and reach a pore throat as shown for example in area 328. Area 328 can include a pore throat that was left unplugged after the introduction of the first polymer solution. Area 328 can include a pore throat that was additionally created by the adsorption of the polymer molecules 306 of the first polymer solution. Once the polymer molecules 326 reach a plug throat, the polymer molecules 326 may plug or hinder further access through the pore throat as shown for example in area 328. There are several reasons this may occur, including the size of the pore throat, the molecular weight of the polymer molecules 326, or the shape of the polymer molecules 326 as they pass into the pore throat. Due to plugging or static hindrance, the polymer molecules 326 are no longer able to access area 330. The void space such as area 330 that can no longer be accessed by polymer molecules 326 becomes an IPV. Because polymer molecules tend to travel faster than solvents or salts upon introduction of a polymer solution, solvents or salts may not penetrate through the plugged pores after the pore throats are completely plugged. On the other hand, if the plugging event is not complete, some solvents or salts may pass through these pore throats. In some embodiments, the actual measurement of the IPV using NMR techniques can be conducted concurrently while introducing the second polymer solution or conducted sequentially after the introduction of the second polymer solution is completed.

Figure 4:
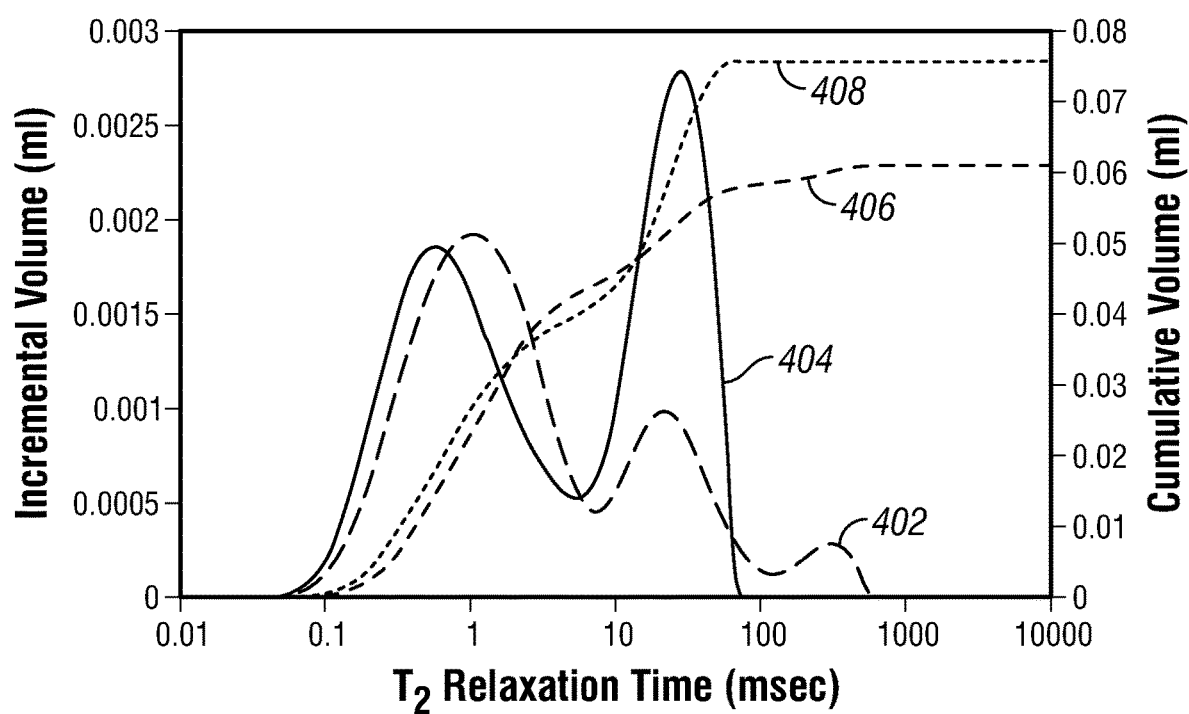
FIG. 4 is a graphical representation of NMR $T_2$ relaxation time distributions in accordance with an embodiment of this disclosure. The long dashed line represents incremental volume of a bulk brine solution having $D_2O$ as a solvent. The solid line represents incremental volume of a 5,500 ppm bulk polymer solution having $D_2O$ as a solvent. The short dashed line represents cumulative volume of the bulk $D_2O$ brine solution. The dotted line represents cumulative volume of the bulk $D_2O$ polymer solution. NMR $T_2$ relaxation time distributions are obtained for about 10 milliliters (ml) of the bulk $D_2O$ brine solution and for about 10 ml of the bulk $D_2O$ polymer solution.

FIG. 4 shows a graphical representation of NMR $T_2$ relaxation time distributions in accordance with an embodiment of this disclosure. The long dashed line 402 represents incremental volume of a bulk brine solution having $D_2O$ as a solvent. The solid line 404 represents incremental volume of a 5,500 ppm bulk polymer solution having $D_2O$ as a solvent. The short dashed line 406 represents cumulative volume of the bulk $D_2O$ brine solution. The dotted line 408 represents cumulative volume of the bulk $D_2O$ polymer solution. NMR $T_2$ relaxation time distributions are obtained for about 10 ml of the bulk $D_2O$ brine solution and for about 10 ml of the bulk $D_2O$ polymer solution. Salts having ions such as halides, sulfates, nitrates, alkalis, alkaline earths, amines, or any combination thereof, can be added to both solutions. As shown in FIG. 4, only a volume of about 0.076 ml among the about 10 ml of the $D_2O$ bulk brine solution is responsive to NMR. Similarly, only a volume of about 0.061 ml among the about 10 ml of the $D_2O$ bulk polymer solution is responsive to NMR. In both cases, these NMR-responsive volumes contribute to less than about 1% of the total volume exposed to NMR. Accordingly, a $D_2O$ polymer solution having a polymer concentration ranging from about zero to about 5,500 ppm would show NMR $T_2$ responsiveness for less than about 1% of the total volume exposed to NMR. Hence, without being bound by any theory, the NMR $T_2$ relaxation of deuterium, the polymer, and other salts can be minimally considered in terms of measuring the IPV.

FIGS. 5A-D show schematic representations of expected sources of NMR signals within a porous medium after a series of polymer-based fluid displacements in accordance with an embodiment of this disclosure. FIG. 5A shows expected sources of NMR signals after a first polymer solution is introduced into the core sample until saturation. Prior to introducing the first polymer solution, the core sample is wetted with a reference solution. The solvent of the reference solution is water. The reference solution may include salts having ions such as halides, sulfates, nitrates, alkalis, alkaline earths, amines, or any combination thereof. The solvent of the first polymer solution is $D_2O$. In some embodiments, the first polymer solution may have a polymer concentration ranging from about 1,500 ppm to about 6,000 ppm. In other embodiments, the first polymer solution may have a polymer concentration ranging from about 2,000 ppm to about 3,000 ppm. One skilled in the art would appreciate that the polymer concentration of the first polymer solution may vary depending on the pore sizes for different reservoirs. Once the first polymer solution is substantially introduced as shown in core sample 504, polymer molecules 506 in the first polymer solution adsorb onto the pore surfaces 508 of the core sample 504. In some embodiments, polymer molecules 506 in the first polymer solution travel through the core sample 504 and adsorb onto pore surfaces 508 as shown for example in area 510. In some embodiments, polymer molecules 506 in the first polymer solution travel through the core sample 504 and reach a pore throat as shown for example in area 510. Once the polymer molecules 506 reach a pore throat, the polymer molecules 506 may plug or hinder further access through the pore throat as shown for example in area 510. There are several reasons this may occur, including the size of the pore throat, the molecular weight of the polymer molecules 506, or the shape of the polymer molecules 506 as they pass into the pore throat. Due to plugging or static hindrance, the polymer molecules 506 are no longer able to access area 514. The void space such as area 514 that can no longer be accessed by polymer molecules 506 becomes an IPV. Because polymer molecules tend to travel faster than solvents or salts upon introduction of a polymer solution, solvents or salts may not penetrate through the plugged pore throats after the pore throats are completely plugged. On the other hand, if the plugging event is not complete, some solvents or salts may pass through these pore throats.

Upon the introduction of the first polymer solution, water originating from the reference solution in open pores such as shown for example in area 516 is substantially replaced with $D_2O$. An NMR measurement would detect signals, if any, from $D_2O$ located in or near the polymer molecules 506 adsorbed onto the surfaces of the porous medium as shown for example in area 510. An NMR measurement would detect signals, if any, from the polymer molecules 506 adsorbed onto the surfaces of the porous medium as shown for example in area 510. An NMR measurement would detect signals, if any, from $D_2O$ of the polymer solution occupying the open pores as shown for example in area 516. An NMR measurement would detect signals, if any, from the polymer molecules located in open pores as shown for example in area 516. However, as shown in FIG. 4, these NMR signals originating from $D_2O$ or the polymer molecules would be minimally considered. On the other hand, without being bound by any theory, because the solvent in the first polymer solution travels slower than the polymer molecules and the polymer molecules can plug a pore throat creating IPV as shown for example in area 514, water from the prior wetting event is maintained in the IPV and would not be replaced with $D_2O$ of the first polymer solution. Hence, an NMR measurement would detect signals from water of the reference solution trapped within a space no longer accessible by polymer molecules 506 as shown for example in area 514. An NMR measurement may not detect signals from water of the reference solution if there is no plugging or the pore throats are not fully plugged.

FIG. 5B shows expected sources of NMR signals after a second polymer solution is introduced into the core sample until saturation. The solvent of the second polymer solution is water. In some embodiments, the second polymer solution may have a polymer concentration ranging from about 1,500 ppm to about 6,000 ppm. In other embodiments, the second polymer solution may have a polymer concentration ranging from about 2,000 ppm to about 3,000 ppm. One skilled in the art would appreciate that the polymer concentration of the second polymer solution may vary depending on the pore sizes for different reservoirs. In some embodiments, the second polymer solution has a polymer concentration substantially the same as the first polymer solution. Because polymer adsorption by polymer molecules 506 in the first polymer solution have reached equilibrium (shown in FIG. 5A), no further plugging events would occur once the second polymer solution is substantially introduced as shown in core sample 524.

Upon the introduction of the second polymer solution, $D_2O$ originating from the first polymer solution in open pores such as shown for example in area 536 is substantially replaced with water. An NMR measurement would detect signals, if any, from $D_2O$ located in or near the polymer molecules 506 adsorbed onto the surfaces of the porous medium as shown for example in area 530. An NMR measurement would detect signals, if any, from the polymer molecules 506 adsorbed onto the surfaces of the porous medium as shown for example in area 530. An NMR measurement would detect signals, if any, from the polymer molecules located in open pores as shown for example in area 536. However, as shown in FIG. 4, these NMR signals originating from $D_2O$ or the polymer molecules would be minimally considered. On the other hand, an NMR measurement would detect signals from water of the reference solution trapped within the space no longer accessible by polymer molecules 506 as shown for example in area 534. An NMR measurement would detect signals from water of the second polymer solution occupying the open pores as shown for example in area 536.

FIG. 5C shows expected sources of NMR signals after a third polymer solution is introduced into the core sample until saturation. The solvent of the third polymer solution is water. The third polymer solution has a lesser polymer concentration than the first and second polymer solution. Without being bound by any theory, a polymer solution having relatively greater polymer concentration has polymer molecules smaller in size than a polymer solution having relatively lesser polymer concentration. Without being bound by any theory, polymer molecules that are relatively smaller in size adsorb to pore surfaces better than polymer molecules that are relatively larger in size. Due to the first polymer solution having polymer molecules smaller in size than the third polymer solution, introduction of the first polymer solution into the core sample ensures that polymer molecules are substantially adsorbed to the pore surfaces. This way, when the third polymer solution is introduced into the core sample for actual IPV evaluation, the polymer molecules of the third polymer solution do not exhibit any adsorption. In some embodiments, the third polymer solution may have a polymer concentration ranging from about 100 ppm to about 1,500 ppm. In other embodiments, the third polymer solution may have a polymer concentration ranging from about 500 ppm to about 1,000 ppm. One skilled in the art would appreciate that the polymer concentration of the third polymer solution may vary depending on the targeted EOR mobility for different reservoirs. Because polymer molecules 506 in the first polymer solution have already adsorbed onto the pore surfaces 508 of the core sample 544, polymer molecules 546 in the third polymer solution would not exhibit further adsorption once the first and second polymer solution is substantially introduced. In some embodiments, once the third polymer solution is substantially introduced as shown in core sample 544, polymer molecules 546 from the third polymer solution travel through the core sample 544 and reach a pore throat as shown for example in area 548. Area 548 can include a pore throat that was left unplugged after the introduction of the first polymer solution. Area 548 can include a pore throat that was additionally created by the adsorption of the polymer molecules 506 of the first polymer solution. Once the polymer molecules 546 reach a pore throat, the polymer molecules 546 may plug or hinder further access through the pore throat as shown for example in area 548. There are several reasons this may occur, including the size of the pore throat, the molecular weight of the polymer molecules 546, or the shape of the polymer molecules 546 as they pass into the pore throat. Due to plugging or static hindrance, the polymer molecules 546 are no longer able to access area 552. The void space such as area 552 that can no longer be accessed by polymer molecules 546 becomes an IPV. Because polymer molecules tend to travel faster than solvents or salts upon introduction of a polymer solution, solvents or salts may not penetrate through the plugged pore throats after the pore throats are completely plugged. On the other hand, if the plugging event is not complete, some solvents or salts may pass through these pore throats.

Upon the introduction of the third polymer solution, water is maintained in open pores such as shown for example in area 556. An NMR measurement would detect signals, if any, from $D_2O$ located in or near the polymer molecules 506 adsorbed onto the surfaces of the porous medium as shown for example in area 550. An NMR measurement would detect signals, if any, from the polymer molecules 506 adsorbed onto the surfaces of the porous medium as shown for example in area 550. An NMR measurement would detect signals, if any, from the polymer molecules located in open pores as shown for example in area 556. An NMR measurement would detect signals, if any, from the plugged polymer molecules as shown for example in area 548. However, as shown in FIG. 4, these signals would be minimally considered. On the other hand, without being bound by any theory, because the solvent in the third polymer solution travels slower than the polymer molecules and the polymer molecules can plug a pore throat as shown for example in area 548 creating the IPV, water originated from the introduction of the second polymer solution is maintained in the IPV as shown for example in area 552. Hence, an NMR measurement would detect signals from water of the second polymer solution trapped within a space no longer accessible by polymer molecules as shown for example in area 552. Optionally, an NMR measurement would detect signals from water of the reference solution trapped within a space no longer accessible by polymer molecules as shown for example in area 554. Additionally, an NMR measurement would detect signals from water located in or near the plugged polymer molecules as shown for example in area 548. An NMR measurement would detect signals from water of the third polymer solution occupying the open pores as shown for example in area 556.

FIG. 5D shows expected sources of NMR signals after a fourth polymer solution is introduced into the core sample until saturation. The solvent of the fourth polymer solution is $D_2O$. In some embodiments, the fourth polymer solution may have a polymer concentration ranging from about 100 ppm to 1,500 ppm. In other embodiments, the fourth polymer solution may have a polymer concentration ranging from about 500 ppm to 1,000 ppm. In some embodiments, the fourth polymer solution has a polymer concentration substantially the same as the third polymer solution. Because polymer plugging by polymer molecules 546 in the third polymer solution is substantially complete (shown in FIG. 5C), no further plugging events would occur once the fourth polymer solution is substantially introduced as shown in core sample 564.

Upon the introduction of the fourth polymer solution, water originating from the third polymer solution in open pores such as shown for example in area 576 is substantially replaced with $D_2O$. An NMR measurement would detect signals, if any, from $D_2O$ located in or near the polymer molecules 506 adsorbed onto the surfaces of the porous medium as shown for example in area 570. An NMR measurement would detect signals, if any, from the polymer molecules 506 adsorbed onto the surfaces of the porous medium as shown for example in area 570. An NMR measurement would detect signals, if any, from $D_2O$ occupying the open pores as shown for example in area 576. An NMR measurement would detect signals, if any, from the polymer molecules located in open pores as shown for example in area 576. An NMR measurement would detect signals, if any, from the plugged polymer molecules as shown for example in area 568. However, as shown in FIG. 4, these NMR signals originating from $D_2O$ or the polymer molecules would be minimally considered. On the other hand, an NMR measurement would detect signals from water of the second polymer solution trapped within a space no longer accessible by polymer molecules as shown for example in area 572. Optionally, an NMR measurement would detect signals from water of the reference solution trapped within a space no longer accessible by polymer molecules as shown for example in area 574. Additionally, an NMR measurement would detect signals from water located in or near the plugged polymer molecules as shown for example in area 568.

In some embodiments, as shown in FIG. 2, values of pore volume can be obtained from analyzing $T_2$ relaxation time distributions. $PV_3$ can be derived by assessing the NMR $T_2$ relaxation time distributions corresponding to NMR signals detected after the introduction of the third polymer solution. Similarly, $PV_4$ can be derived by assessing the NMR $T_2$ relaxation time distributions corresponding to NMR signals detected after the introduction of the fourth polymer solution. In some embodiments, the difference between the two pore volume values correspond to the magnitude of the IPV.

FIG. 6 shows a schematic representation of a workflow for assessing the IPV using NMR $T_2$ measurement techniques in accordance with an embodiment of this disclosure. The solid line in graph 606 represents incremental volume of a NMR $T_2$ relaxation time distribution for determining $PV_{CI}$. The short dashed line in graph 612 represents incremental volume of a NMR $T_2$ relaxation time distribution for determining $PV_1$. The intermediate dashed line in graph 618 represents incremental volume of a NMR $T_2$ relaxation time distribution for determining $PV_2$. In block 602, a core sample of a porous medium is obtained. The core sample is wetted with a reference solution until saturation. The solvent of the reference solution is water. The reference solution may include various salts having ions such as halides, sulfates, nitrates, alkalis, alkaline earths, amines, or any combination thereof.

Referring to block 604, an NMR measurement is conducted for detecting water originating from the reference solution in the core sample. A $T_2$ relaxation time distribution is obtained for the reference solution as shown for example in graph 606. In some embodiments, the NMR measurement is conducted after the core sample is fully wetted with the reference solution. In other embodiments, the NMR measurement is conducted during the wetting process, continuously or intermittently, until the NMR $T_2$ relaxation time distribution shown for example in graph 606 exhibits no further changes. $PV_{CI}$ is derived by integrating the area of the NMR $T_2$ relaxation time distribution shown for example in graph 606 using an embodiment of the method shown in FIG. 2.

In other embodiments, $PV_{CI}$ of a core sample can be measured in the lab or on the field by utilizing any conventional method capable of determining pore volumes. For example, $PV_{CI}$ of a core sample can be measured by using a coreflood apparatus similar to one shown in FIG. 1 and by analyzing the effluent.

Referring to block 608, a first polymer solution is introduced into the core sample until saturation. The solvent of the first polymer solution is $D_2O$. In some embodiments, the first polymer solution may have a polymer concentration ranging from about 1,500 ppm to about 6,000 ppm. In other embodiments, the first polymer solution may have a polymer concentration ranging from about 2,000 ppm to about 3,000 ppm. One skilled in the art would appreciate that the polymer concentration of the first polymer solution may vary depending on the pore sizes for different reservoirs. The first polymer solution may include various salts having ions such as halides, sulfates, nitrates, alkalis, alkaline earths, amines, or any combination thereof.

Referring to block 610, an NMR measurement is conducted for detecting water from expected sources in a core sample shown for example in FIG. 5A. A $T_2$ relaxation time distribution is obtained as shown for example in graph 612. In some embodiments, the NMR measurement is conducted after the first polymer solution is substantially introduced into the core sample and polymer adsorption reaches equilibrium. In other embodiments, the NMR measurement is conducted during the introduction of the first polymer solution, continuously or intermittently, until the NMR $T_2$ relaxation time distribution shown for example in graph 612 exhibits no further changes. Without being bound by any theory, NMR monitoring is conducted to ensure that polymer molecules in the first polymer solution substantially adsorb onto the pore surfaces of the core sample, as shown for example in FIG. 5A. In some embodiments, as shown for example in FIG. 5A, polymer molecules in the first polymer solution travel through the core sample and reach a pore throat. Once the polymer molecules reach a pore throat, the polymer molecules may plug or hinder further access through the pore throat. There are several reasons this may occur, including the size of the pore throat, the molecular weight of the polymer molecules, or the shape of the polymer molecules as they pass into the pore throat. Due to plugging or static hindrance, the void space where polymer molecules are no longer able to access becomes an IPV. Upon the introduction of the first polymer solution in block 608, water originating from the reference solution in open pores is substantially replaced with $D_2O$. On the other hand, without being bound by any theory, because the solvent in the first polymer solution travels slower than the polymer molecules and the polymer molecules can plug a pore throat creating IPV as shown for example in FIG. 5A, water from the prior wetting event is maintained in the IPV and would not be replaced with $D_2O$ of the first polymer solution. Hence, in block 610, an NMR measurement would detect signals from water of the reference solution trapped within a space no longer accessible by polymer molecules. An NMR measurement may not detect signals from water of the reference solution if there is no plugging or the pore throats are not fully plugged. $PV_1$ can be derived by integrating the area of the NMR $T_2$ relaxation time distribution obtained upon saturation shown for example in graph 612 using an embodiment of the method shown in FIG. 2.

Referring to block 614, a second polymer solution is introduced into the core sample until saturation. The solvent of the second polymer solution is water. In some embodiments, the second polymer solution may have a polymer concentration ranging from about 1,500 ppm to about 6,000 ppm. In other embodiments, the second polymer solution may have a polymer concentration ranging from about 2,000 ppm to about 3,000 ppm. One skilled in the art would appreciate that the polymer concentration of the second polymer solution may vary depending on the pore sizes for different reservoirs. In some embodiments, the second polymer solution has a polymer concentration substantially the same as the first polymer solution. The second polymer solution may include various salts having ions such as halides, sulfates, nitrates, alkalis, alkaline earths, amines, or any combination thereof.

Referring to block 616, an NMR measurement is conducted for detecting water from expected sources in a core sample shown for example in FIG. 5B. A $T_2$ relaxation time distribution is obtained as shown for example in graph 618. In some embodiments, the NMR measurement is conducted after the second polymer solution is substantially introduced into the core sample. In other embodiments, the NMR measurement is conducted during the introduction of the second polymer solution, continuously or intermittently, until the NMR $T_2$ relaxation time distribution shown for example in graph 618 exhibits no further changes. Without being bound by any theory, NMR monitoring is conducted to ensure that $D_2O$ originating from the first polymer solution in open pores is substantially replaced with water in the second polymer solution, as shown for example in FIG. 5B. In some embodiments, as shown for example in FIG. 5B, water trapped due to the plugging by the introduction of the first polymer solution is maintained in the IPV. In block 616, an NMR measurement would detect signals from water originating from the reference solution trapped within a space no longer accessible by polymer molecules. An NMR measurement would also detect signals from the second polymer solution occupying the open pores. $PV_2$ can be derived by integrating the area of the NMR $T_2$ relaxation time distribution obtained upon saturation shown for example in graph 618 using an embodiment of the method shown in FIG. 2.

In some embodiments, at least one of the sequences shown in FIG. 6 can be omitted if polymer adsorption is substantially absent. In some embodiments, at least one of the sequences shown in FIG. 6 can be omitted if the $PV_{CI}$ of the core sample can be measured in the lab or on the field by utilizing any conventional method capable of determining pore volumes. For example, $PV_{CI}$ of a core sample can be measured by using a coreflood apparatus similar to one shown in FIG. 1 and by analyzing the effluent.

FIG. 7 shows a schematic representation of a workflow for assessing the IPV using NMR $T_2$ measurement techniques in accordance with an embodiment of this disclosure. The dotted line in graph 706 represents incremental volume of a NMR $T_2$ relaxation time distribution for determining $PV_3$. The long dashed line in graph 712 represents incremental volume of a NMR $T_2$ relaxation time distribution for determining $PV_4$. In block 702, a third polymer solution is introduced into the core sample until saturation. The solvent of the third polymer solution is water. In some embodiments, the third polymer solution may have a polymer concentration ranging from about 100 ppm to about 1,500 ppm. In other embodiments, the third polymer solution may have a polymer concentration ranging from about 500 ppm to about 1,000 ppm. One skilled in the art would appreciate that the polymer concentration of the second polymer solution may vary depending on the targeted EOR mobility for different reservoirs. In some embodiments, the third polymer solution has a polymer concentration substantially less than the first polymer solution. In some embodiments, the third polymer solution has a polymer concentration substantially less than the second polymer solution. Without being bound by any theory, a polymer solution having relatively greater polymer concentration has polymer molecules smaller in size than a polymer solution having relatively lesser polymer concentration. Without being bound by any theory, polymer molecules that are relatively smaller in size adsorb to pore surfaces better than polymer molecules that are relatively larger in size. Due to the first polymer solution having polymer molecules smaller in size than the second polymer solution, introduction of the first and second polymer solution into the core sample ensures that polymer molecules are substantially adsorbed to the pore surfaces. This way, when the third polymer solution is introduced into the core sample for actual IPV evaluation, the polymer molecules of the third polymer solution do not exhibit any adsorption. The third polymer solution may include various salts having ions such as halides, sulfates, nitrates, alkalis, alkaline earths, amines, or any combination thereof.

Referring to block 704, an NMR measurement is conducted for detecting water from expected sources in a core sample shown for example in FIG. 5C. A $T_2$ relaxation time distribution is obtained as shown for example in graph 706. In some embodiments, the NMR measurement is conducted after the third polymer is substantially introduced into the core sample and polymer plugging reaches equilibrium. In other embodiments, the NMR measurement is conducted during the introduction of the third polymer solution, continuously or intermittently, until the NMR $T_2$ relaxation time distribution shown for example in graph 706 exhibits no further changes. Because polymer molecules in the first polymer solution have already adsorbed onto the pore surfaces of the core sample, polymer molecules in the third polymer solution would not exhibit further adsorption once the first and second polymer solution is substantially introduced. Without being bound by any theory, NMR monitoring is conducted to ensure that polymer molecules in the third polymer solution plug any pore throats that were left unplugged after the introduction of the first polymer solution, as shown for example in FIG. 5C. Without being bound by any theory, NMR monitoring is conducted to ensure that polymer molecules in the third polymer solution plug any pore throats that were additionally created by the introduction of the first polymer solution, as shown for example in FIG. 5C. No further polymer adsorption is observed. In some embodiments, as shown for example in FIG. 5C, polymer molecules in the third polymer solution travel through the core sample and reach a pore throat. Once the polymer molecules reach a pore throat, the polymer molecules may plug or hinder further access through the pore throat. There are several reasons this may occur, including the size of the pore throat, the molecular weight of the polymer molecules, or the shape of the polymer molecules as they pass into the pore throat. Due to plugging or static hindrance, the void space where polymer molecules are no longer able to access becomes an IPV. Upon the introduction of the third polymer solution in block 702, water is maintained in open pores. Without being bound by any theory, because the solvent in the third polymer solution travels slower than the polymer molecules and the polymer molecules can plug a pore throat creating IPV as shown for example in FIG. 5C, water originating from the introduction of the second polymer solution is maintained in the IPV. Hence, in block 704, an NMR measurement would detect signals from water of the second polymer solution trapped within a space no longer accessible by polymer molecules. Optionally, an NMR measurement would detect signals from water of the reference solution trapped within a space no longer accessible by polymer molecules. Additionally, an NMR measurement would detect signals from water located in or near the plugged polymer molecules. An NMR measurement would detect signals from water of the third polymer solution occupying the open pores. $PV_3$ can be derived by integrating the area of the NMR $T_2$ relaxation time distribution obtained upon saturation shown for example in graph 706 using an embodiment of the method shown in FIG. 2.

Referring to block 708, a fourth polymer solution is introduced into the core sample until saturation. The solvent of the fourth polymer solution is $D_2O$. In some embodiments, the fourth polymer solution may have a polymer concentration ranging from about 100 ppm to about 1,500 ppm. In other embodiments, the fourth polymer solution may have a polymer concentration ranging from about 500 ppm to about 1,000 ppm. In some embodiments, the fourth polymer solution has a polymer concentration substantially the same as the third polymer solution. The fourth polymer solution may include various salts having ions such as halides, sulfates, nitrates, alkalis, alkaline earths, amines, or any combination thereof.

Referring to block 710, an NMR measurement is conducted for detecting water from expected sources shown for example in FIG. 5D. A $T_2$ relaxation time distribution is obtained as shown for example in graph 712. In some embodiments, the NMR measurement is conducted after the fourth polymer solution is substantially introduced into the core sample. In other embodiments, the NMR measurement is conducted during the introduction of the fourth polymer solution, continuously or intermittently, until the NMR $T_2$ relaxation time distribution shown for example in graph 712 exhibits no further changes. Without being bound by any theory, NMR monitoring is conducted to ensure that water originating from the third polymer solution in open pores is substantially replaced with $D_2O$ in the fourth polymer solution, as shown for example in FIG. 5D. In some embodiments, as shown for example in FIG. 5D, water trapped due to the plugging by the introduction of the third polymer solution is maintained in the IPV. Optionally, as shown for example in FIG. 5D, water trapped due to the plugging by the introduction of the first polymer solution is maintained in the IPV. Optionally, trapped water may include water located in or near the plugged polymer molecules originating from the third polymer solution. In block 710, an NMR measurement would detect signals from water originating from the second polymer solution trapped within a space no longer accessible by polymer molecules. Optionally, an NMR would detect signals from water originating from the reference solution trapped within a space no longer accessible by polymer molecules. Optionally, an NMR would also detect signals from water in or near the plugged polymer molecules originating from the third polymer solution. $PV_4$ can be derived by integrating the area of the NMR $T_2$ relaxation time distribution obtained upon saturation shown for example in graph 712 using an embodiment of the method shown in FIG. 2.

Figure 8:
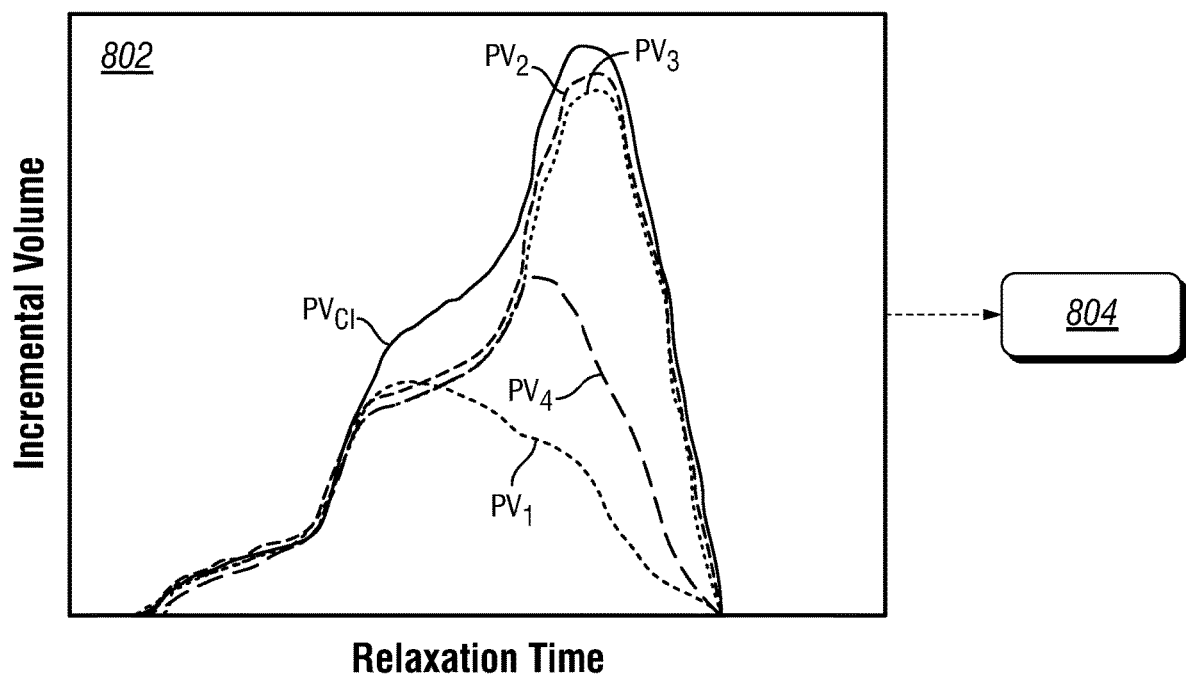
FIG. 8 shows a schematic representation of a workflow for assessing the IPV using NMR $T_2$ measurement techniques in accordance with an embodiment of this disclosure. In the graphs, the solid line represents incremental volume of a NMR $T_2$ relaxation time distribution for determining $PV_{CI}$. The short dashed line represents incremental volume of a NMR $T_2$ relaxation time distribution for determining $PV_1$. The intermediate dashed line represents incremental volume of a NMR $T_2$ relaxation time distribution for determining $PV_2$. The dotted line represents incremental volume of a NMR $T_2$ relaxation time distribution for determining $PV_3$. The long dashed line represents incremental volume of a NMR $T_2$ relaxation time distribution for determining $PV_4$.

FIG. 8 shows a schematic representation of a workflow for assessing the IPV using NMR $T_2$ measurement techniques in accordance with an embodiment of this disclosure. The solid line in graph 802 represents incremental volume of a NMR $T_2$ relaxation time distribution for determining $PV_{CI}$. The short dashed line in graph 802 represents incremental volume of a NMR $T_2$ relaxation time distribution for determining $PV_1$. The intermediate dashed line in graph 802 represents incremental volume of a NMR $T_2$ relaxation time distribution for determining $PV_2$. The dotted line in graph 802 represents incremental volume of a NMR $T_2$ relaxation time distribution for determining $PV_3$. The long dashed line in graph 802 represents incremental volume of a NMR $T_2$ relaxation time distribution for determining $PV_4$. As shown in graph 802, NMR $T_2$ relaxation distributions obtained in the sequences shown in FIGS. 6 and 7 are comparatively assessed to determine the magnitude of the IPV. In some embodiments, $PV_{CI}$, $PV_1$, and $PV_2$ can be derived by integrating the area of the NMR $T_2$ relaxation time distributions obtained during the sequences shown in FIG. 6. In some embodiments, $PV_3$ and $PV_4$ can be derived by integrating the area of the NMR $T_2$ relaxation time distributions obtained during the sequences shown in FIG. 7. In other embodiments, $PV_{CI}$, $PV_1$, $PV_2$, $PV_3$, and $PV_4$ can be derived directly from the relaxation time spectra shown graph 802. As shown in graph 802, without being bound by any theory, the NMR $T_2$ relaxation distribution corresponding to $PV_{CI}$ would exhibit a greater integrated area than that of any of $PV_1$, $PV_2$, $PV_3$, and $PV_4$ due to a greater number of water molecules present in the core sample. As shown in graph 802, without being bound by any theory, the NMR $T_2$ relaxation distribution corresponding to $PV_2$ would exhibit a greater integrated area than that of $PV_1$ due to a greater number of water molecules present in the core sample, as shown in FIGS. 5A-B. As shown in graph 802, without being bound by any theory, the NMR $T_2$ relaxation distribution corresponding to $PV_3$ would exhibit a greater integrated area than that of $PV_4$ due to a greater number of water molecules present in the core sample, as shown in FIGS. 5C-D. Accordingly, as shown for example in graph 802, $PV_{CI}$ would have a greater pore volume value than that of any of $PV_1$, $PV_2$, $PV_3$, and $PV_4$. As shown for example in graph 802, $PV_2$ would have a greater pore volume value than that of $PV_1$. As shown for example in graph 802, $PV_3$ would have a greater pore volume value than that of $PV_4$.

Referring to block 804, IPV is assessed by utilizing $PV_{CI}$, $PV_3$, and $PV_4$ as parameters. Without being bound by any theory, the difference between the derived pore volume values of $PV_3$ and $PV_4$ corresponds to the volume of total open pores of the core sample. Accordingly, without being bound by any theory, the total IPV value can be derived from taking the $PV_{CI}$ and subtracting the volume of the total open pores of the core sample, which is equivalent to ($PV_3-PV_4$). This is expressed by equation (2):

$$IPV = \frac{(PV_{CI} - PV_3 + PV_4)}{PV_{CI}} \times 100 \qquad (2)$$

where IPV is the total inaccessible pore volume expressed in percentage (%).

In some embodiments, at least one of the sequences shown in FIG. 6 can be omitted if polymer adsorption is substantially absent. In some embodiments, at least one of the sequences shown in FIG. 6 can be omitted if the $PV_{CI}$ of the core sample can be measured in the lab or on the field by utilizing any conventional method capable of determining pore volumes. For example, $PV_{CI}$ of a core sample can be measured by using a coreflood apparatus similar to one shown in FIG. 1 and by analyzing the effluent.

When polymer adsorption is substantially absent, referring back to block 702 of FIG. 7, a first polymer solution can be introduced into the core sample until saturation after the core sample is water wet. The solvent of the first polymer solution is water. In some embodiments, the first polymer solution may have a polymer concentration ranging from about 100 ppm to about 6,000 ppm. In other embodiments, the first polymer solution may have a polymer concentration ranging from about 300 ppm to about 2,000 ppm. Yet in other embodiments, the first polymer solution may have a polymer concentration ranging from about 500 ppm to about 1,000 ppm. The first polymer solution may include various salts having ions such as halides, sulfates, nitrates, alkalis, alkaline earths, amines, or any combination thereof.

Referring to block 704, an NMR measurement is conducted for detecting water from expected sources in a core sample shown for example in FIG. 5C. A $T_2$ relaxation time distribution is obtained as shown for example in graph 706. In some embodiments, the NMR measurement is conducted after the first polymer is substantially introduced into the core sample and polymer plugging reaches equilibrium. In other embodiments, the NMR measurement is conducted during the introduction of the first polymer solution, continuously or intermittently, until the NMR $T_2$ relaxation time distribution shown for example in graph 706 exhibits no further changes. No polymer adsorption is observed. Without being bound by any theory, NMR monitoring is conducted to ensure that polymer molecules in the first polymer solution plug the pore throats as shown for example in FIG. 5C. In some embodiments, as shown for example in FIG. 5C, polymer molecules in the first polymer solution travel through the core sample and reach a pore throat. Once the polymer molecules reach a pore throat, the polymer molecules may plug or hinder further access through the pore throat. There are several reasons this may occur, including the size of the pore throat, the molecular weight of the polymer molecules, or the shape of the polymer molecules as they pass into the pore throat. Due to plugging or static hindrance, the void space where polymer molecules are no longer able to access becomes an IPV. Upon the introduction of the first polymer solution in block 702, water is maintained in open pores. Without being bound by any theory, because the solvent in the first polymer solution travels slower than the polymer molecules and the polymer molecules can plug a pore throat creating IPV as shown for example in FIG. 5C, water originating from the initial wetting event is maintained in the IPV. Hence, in block 704, an NMR measurement would detect signals from water originating from the initial wetting event trapped within a space no longer accessible by polymer molecules. Additionally, an NMR measurement would detect signals from water located in or near the plugged polymer molecules. An NMR measurement would detect signals from water of the first polymer solution occupying the open pores. $PV_3$ can be derived by integrating the area of the NMR $T_2$ relaxation time distribution obtained upon saturation shown for example in graph 706 using an embodiment of the method shown in FIG. 2.

When polymer adsorption is substantially absent, referring back to block 708, a second polymer solution can be introduced into the core sample until saturation. The solvent of the second polymer solution is $D_2O$. In some embodiments, the second polymer solution may have a polymer concentration ranging from about 100 ppm to about 6,000 ppm. In other embodiments, the second polymer solution may have a polymer concentration ranging from about 300 ppm to about 2,000 ppm. Yet in other embodiments, the second polymer solution may have a polymer concentration ranging from about 500 ppm to about 1,000 ppm. In some embodiments, the second polymer solution has a polymer concentration substantially the same as the first polymer solution. The second polymer solution may include various salts having ions such as halides, sulfates, nitrates, alkalis, alkaline earths, amines, or any combination thereof.

Referring to block 710, an NMR measurement is conducted for detecting water from expected sources shown for example in FIG. 5D. A $T_2$ relaxation time distribution is obtained as shown for example in graph 712. In some embodiments, the NMR measurement is conducted after the second polymer solution is substantially introduced into the core sample. In other embodiments, the NMR measurement is conducted during the introduction of the second polymer solution, continuously or intermittently, until the NMR $T_2$ relaxation time distribution shown for example in graph 712 exhibits no further changes. Without being bound by any theory, NMR monitoring is conducted to ensure that water originating from the first polymer solution in open pores is substantially replaced with $D_2O$ in the second polymer solution, as shown for example in FIG. 5D. In some embodiments, as shown for example in FIG. 5D, water trapped due to the plugging by the introduction of the first polymer solution is maintained in the IPV. Optionally, trapped water may include water located in or near the plugged polymer molecules originating from the first polymer solution. In block 710, an NMR measurement would detect signals from water originating from the initial wetting event trapped within a space no longer accessible by polymer molecules. Optionally, an NMR would also detect signals from water in or near the plugged polymer molecules originating from the first polymer solution. $PV_4$ can be derived by integrating the area of the NMR $T_2$ relaxation time distribution obtained upon saturation shown for example in graph 712 using an embodiment of the method shown in FIG. 2.

When polymer adsorption is substantially absent, referring back to graph 802 of FIG. 8, NMR $T_2$ relaxation distributions obtained in the sequences shown in FIG. 7 can be comparatively assessed to determine the magnitude of the IPV. In some embodiments, $PV_{CI}$ can be measured in the lab or on the field by utilizing any conventional method capable of determining pore volumes. In some embodiments, $PV_3$ and $PV_4$ can be derived by integrating the area of the NMR $T_2$ relaxation time distributions obtained during the sequences shown in FIG. 7. In other embodiments, $PV_{CI}$, $PV_3$, and $PV_4$ can be derived directly from the relaxation time spectra shown graph 802. As shown in graph 802, without being bound by any theory, the NMR $T_2$ relaxation distribution corresponding to $PV_{CI}$ would exhibit a greater integrated area than that of any of $PV_3$ and $PV_4$ due to a greater number of water molecules present in the core sample. As shown in graph 802, without being bound by any theory, the NMR $T_2$ relaxation distribution corresponding to $PV_3$ would exhibit a greater integrated area than that of $PV_4$ due to a greater number of water molecules present in the core sample, as shown in FIGS. 5C-D. Accordingly, as shown for example in graph 802, $PV_{CI}$ would have a greater pore volume value than that of any of $PV_3$ and $PV_4$. As shown for example in graph 802, $PV_3$ would have a greater pore volume value than that of $PV_4$.

Referring to block 804, IPV can be assessed by utilizing $PV_{CI}$, $PV_3$, and $PV_4$ as parameters. Without being bound by any theory, the difference between the derived pore volume values of $PV_3$ and $PV_4$ corresponds to the volume of total open pores of the core sample. Accordingly, without being bound by any theory, the total IPV value can be derived from taking the $PV_{CI}$ and subtracting the volume of the total open pores of the core sample, which is equivalent to $(PV_3-PV_4)$, as shown in equation (2).

In some embodiments, to successfully design a polymer flood for EOR from a hydrocarbon-bearing formation, one may conduct a series of IPV assessments for different polymer candidates. Multiple core samples can be obtained from the hydrocarbon-bearing formation, where IPV is determined for each of the core samples. Each core sample can be flooded with at least two polymer compositions. Each polymer composition is significantly different from one another in terms of polymer types, polymer concentrations, salt compositions, and solvent compositions. IPV values for each core sample can be determined by obtaining and evaluating NMR $T_2$ relaxation time distributions for each of the core samples using embodiments of the methods described in this disclosure. After determining IPV values for each core sample, one may select the polymer composition having the least IPV value. Without being bound by any theory, a lesser IPV value corresponds to the polymer composition having greater accessibility to pores in porous media. A polymer slug or bank solution can be prepared using the polymer composition having the least IPV value. The polymer slug or bank solution can be subsequently introduced downhole into the formation for EOR. One skilled in the art would appreciate that the selection of a certain polymer composition depends on permeability and required mobility for a given reservoir, and the economic value of the polymer.

Embodiments of the disclosure described, therefore, are well adapted to carry out the objects and attain the ends and advantages mentioned, as well as others that are inherent. While example embodiments of the disclosure have been given for purposes of disclosure, numerous changes exist in the details of procedures for accomplishing the desired results. These and other similar modifications will readily suggest themselves to those skilled in the art, and are intended to be encompassed within the spirit of the present disclosure and the scope of the appended claims.

What is claimed is:

1. A method for determining inaccessible pore volume (IPV) of a porous medium for polymer flooding, the method comprising the steps of:
    providing a core sample of the porous medium;
    determining a total pore volume ($PV_{CI}$) of the core sample;
    introducing a first polymer solution into the core sample until saturation, where the first polymer solution comprises water and a polymer, where the polymer is configured to plug at least one pore throat of the core sample;
    determining a first pore volume ($PV_3$) by obtaining nuclear magnetic resonance (NMR) relaxation time of $^1H$ within the core sample;
    introducing a second polymer solution into the core sample until saturation, where the second polymer solution comprises deuterium oxide and the polymer, where the first polymer solution and the second polymer solution have substantially the same polymer concentration;
    determining a second pore volume ($PV_4$) by obtaining NMR relaxation time of $^1H$ within the core sample;
    assessing the IPV by utilizing $PV_{CI}$, $PV_3$, and $PV_4$ as parameters.

2. The method of claim 1, further comprising the step of:
    wetting the core sample with a reference solution until saturation, where the reference solution comprises water.

3. The method of claim 1, where the $PV_{CI}$ is determined by obtaining NMR relaxation time of $^1H$ within the core sample.

4. The method of claim 1, where the polymer is selected from a group consisting of: polyacrylamides, sulfonated polyacrylamides, xanthan gum, hydrophobically modified ethoxylated urethanes, and combinations thereof.

5. The method of claim 1, where the first polymer solution has a polymer concentration ranging from about 100 parts per million to about 1,500 parts per million.

6. The method of claim 1, where the NMR relaxation time is a transverse ($T_2$) relaxation time.

7. The method of claim 1, further comprising the step of:
    introducing a third polymer solution into the core sample until saturation prior to the introducing the first polymer solution step, where the third polymer solution comprises deuterium oxide and the polymer, where the third polymer solution has a greater polymer concentration than the first polymer solution, where the polymer is configured to adsorb onto the pore surfaces of the core sample.

8. The method of claim 7, further comprising the step of:
    introducing a fourth polymer solution into the core sample until saturation prior to the introducing the first polymer solution step but after the introducing the third polymer solution step, where the fourth polymer solution comprises water and the polymer, where the third polymer solution and the fourth polymer solution have substantially the same polymer concentration.

9. The method of claim 7, where the third polymer solution has a polymer concentration ranging from about 1,500 parts per million to about 6,000 parts per million.

10. A method for determining inaccessible pore volume (IPV) of a porous medium for polymer flooding, the method comprising the steps of:
    providing a core sample of the porous medium;
    wetting the core sample with a reference solution until saturation, where the reference solution comprises water;
    determining a total pore volume ($PV_{CI}$) by obtaining nuclear magnetic resonance (NMR) transverse ($T_2$) relaxation time of water within the core sample;
    introducing a first polymer solution into the core sample and monitoring the introduction by obtaining NMR $T_2$ relaxation time of water within the core sample until saturation, where the first polymer solution comprises deuterium oxide and a polymer, where the polymer is configured to adsorb onto the pore surfaces of the core sample;
    introducing a second polymer solution into the core sample and monitoring the introduction by obtaining NMR $T_2$ relaxation time of water within the core sample until saturation, where the second polymer comprises water and the polymer, where the first polymer solution and the second polymer solution have substantially the same polymer concentration;
    introducing a third polymer solution into the core sample and monitoring the introduction by obtaining NMR $T_2$ relaxation time of water within the core sample until saturation to determine a first pore volume ($PV_3$), where the third polymer solution comprises water and the polymer, where the first polymer solution has a greater polymer concentration than the third polymer solution, where the polymer is configured to plug at least one pore throat of the core sample;
    introducing a fourth polymer solution into the core sample and monitoring the introduction by obtaining NMR $T_2$ relaxation time of water within the core sample until saturation to determine a second pore volume ($PV_4$), where the fourth polymer solution comprises deuterium oxide and the polymer, where the third polymer solution and the fourth polymer solution have substantially the same polymer concentration;
    assessing the IPV by utilizing $PV_{CI}$, $PV_3$, and $PV_4$ as parameters.

11. The method of claim 10, where the polymer is selected from a group consisting of:
    polyacrylamides, sulfonated polyacrylamides, xanthan gum, hydrophobically modified ethoxylated urethanes, and combinations thereof.

12. The method of claim 10, where the first polymer solution has a polymer concentration ranging from about 1,500 parts per million to about 6,000 parts per million.

13. The method of claim 10, where the third polymer solution has a polymer concentration ranging from about 100 parts per million to about 1,500 parts per million.

14. The method of claim 10, in the step of introducing the first polymer solution, the polymer is configured to plug at least one pore throat.

15. A method for enhanced oil recovery from a hydrocarbon-bearing formation using polymer flooding, the method comprising the steps of:
    obtaining core samples from the hydrocarbon-bearing formation;
    determining inaccessible pore volume (IPV) for each of the core samples, where each of the core samples is flooded with at least two polymer compositions, where each polymer composition is significantly different from one another;
    preparing a polymer slug, where the polymer slug comprises one of the at least two polymer compositions in the determining step; and introducing the polymer slug into the formation for enhanced oil recovery, where the determining step further comprises the steps of:

determining a total pore volume ($PV_{CI}$) for each of the core samples;

introducing a first polymer solution into each of the core samples until saturation, where the first polymer solution comprises water and one of the at least two polymer compositions for each of the core samples, where the one of the at least two polymer compositions is configured to plug at least one pore throat of each of the core samples;

determining a first pore volume ($PV_3$) for each of the core samples by measuring nuclear magnetic resonance (NMR) transverse ($T_2$) relaxation time of $^1H$ within each of the core samples;

introducing a second polymer solution into each of the core samples until saturation, where the second polymer solution comprises deuterium oxide and the one of the at least two polymer compositions for each of the core samples, where the first polymer solution and the second polymer solution have substantially the same polymer concentration;

determining a second pore volume ($PV_4$) for each of the core samples by measuring NMR $T_2$ relaxation time of $^1H$ within each of the core samples; and assessing the IPV by utilizing $PV_{CI}$, $PV_3$, and $PV_4$ as parameters for each of the core samples.

16. The method of claim 15, where the first polymer solution has a polymer concentration ranging from about 100 parts per million to about 1,500 parts per million.

17. The method of claim 15, further comprising the step of:

introducing a third polymer solution into each of the core samples until saturation, where the third polymer solution comprises deuterium oxide and the one of the at least two polymer compositions for each of the core samples, where the third polymer solution has a greater polymer concentration than the first polymer solution, where the one of the at least two polymer compositions is configured to adsorb onto the pore surfaces of each of the core samples.

18. The method of claim 17, further comprising the step of:

introducing a fourth polymer solution into each of the core samples until saturation, where the fourth polymer solution comprises water and the one of the at least two polymer compositions for each of the core samples, where the third polymer solution and the fourth polymer solution have substantially the same polymer concentration.

19. The method of claim 17, where the third polymer solution has a polymer concentration ranging from about 1,500 parts per million to about 6,000 parts per million.

* * * * *